United States Patent [19]

Campbell et al.

[11] 4,332,029
[45] May 25, 1982

[54] AUTOMATIC ALIGNMENT SYSTEM FOR A DIGITAL MODEM

[75] Inventors: David K. Campbell; Luther L. Crabtree, both of Melbourne, Fla.

[73] Assignee: Harris Corporation, Melbourne, Fla.

[21] Appl. No.: 150,294

[22] Filed: May 16, 1980

[51] Int. Cl.³ ............................................. G01R 31/28
[52] U.S. Cl. .................................. 371/22; 324/73 R; 455/226; 371/28
[58] Field of Search .................... 371/5, 20, 28, 22; 375/10; 455/62, 63, 67, 226; 324/73 R, 73 AT

[56] References Cited

U.S. PATENT DOCUMENTS

| | | | |
|---|---|---|---|
| 2,978,647 | 4/1961 | Lehmann | 455/226 |
| 2,978,655 | 4/1961 | Fernsler | 455/226 |
| 3,622,877 | 11/1971 | MacDavid et al. | 375/10 |
| 3,652,938 | 3/1972 | Byers et al. | 455/226 |
| 3,842,247 | 10/1974 | Anderson | 375/10 |
| 3,889,255 | 6/1975 | Petterson | 364/571 |
| 4,197,500 | 4/1980 | Klein et al. | 455/62 |
| 4,238,779 | 12/1980 | Dickinson et al. | 371/22 |

Primary Examiner—Charles E. Atkinson
Attorney, Agent, or Firm—Craig and Antonelli

[57] ABSTRACT

An automatic alignment system for use in a digital modem, having a performance indicator circuit associated therewith, adjusts the control voltages applied to selected alignment points therein in order to minimize the error indication output of the performance indicator circuit. The alignment system interfaces with a microprocessor and provides the necessary timing mechanism to generate write pulses which control the operation of respective processing circuits associated with the various alignment points in the modem analog unit. Each of the processing circuits in the modem analog unit includes a digital-to-analog converter, a data latch, and an amplifier which processes the output of the microprocessor interface to generate an analog control voltage.

20 Claims, 5 Drawing Figures

AUTOMATIC ALIGNMENT SYSTEM FOR A DIGITAL MODEM

BACKGROUND OF THE INVENTION

1. Field of the Invention

The present invention relates to an automatic alignment system for use with a digital modem which operates to automatically control one or more alignment points in the modem to optimize modem operation on the basis of a performance indicator measurement.

2. Description of the Prior Art

A typical data transmission system, such as those used in satellite communications, includes a digital modem which normally needs to be adjusted on site for obtaining optimum performance characteristics, particularly at start up. These performance characteristics are measured as an error rate in the digital modem, which measurement may be accomplished in various ways. One way is to compare the expected value of the incoming signal with the actual received signal. The result of this comparison is then reflected as a bit error rate (BER). However, this requires a prior knowledge of the value of the incoming signal.

Another method of determining the BER involves a "link performance indicator circuit" (LPI), of the type which is the subject of copending application Ser. No. 138,456 filed Apr. 8, 1980, and which is assigned to the assignee of the present invention. This link performance indicator circuit provides an estimate of the bit error rate by developing "pseudo-errors" as a result of a comparison of the incoming signal to an average value of the incoming signal. These "pseudo-errors" provide a relationship to the real errors based on known relationships, and therefore, does not require a prior knowledge of the value of the incoming digital signal.

Previously, the alignment of the digital modem was accomplished by the use of alignment points which were manually adjusted for optimum performance. This alignment of each point was accomplished on an individually adjusted basis by trained personnel in order to attain a minimum reading of the measure of the performance, such as provided by the LPI signal at the output of the above-mentioned link performance indicator circuit. However, all of the alignment points typically interact with one another, and therefore, several passes through all the alignment points are required before the adjusting operation provides assurance of good alignment. Such a system requires highly-trained personnel and takes an inordinate amount of time to properly fine tune the system.

Prior art attempts at effecting automatic changes in the performance of a data transmission system have been addressed to error correction systems which treat burst errors and random errors in a somewhat effective manner through forward error correction, as illustrated in the patent to Lutzker, U.S. Pat. No. 3,657,700, and the patent to Abramson, et al., U.S. Pat. No. 3,506,961. However, none of the prior art systems are based upon the automatic adjustment of alignment points of the modem or serve to properly align the unit prior to effective use.

The patent to Lutzker, U.S. Pat. No. 3,657,700, discloses the use of an error correcting data communication system which has the capability of varying the error correction potential without varying the codes or increasing the redundancy of transmitted data. This is accomplished by a buffer, having several stages, which is utilized during the transmission of processing control signals in order to request a change in the value of an adaptive parameter. When a correctable error occurs, a bit is read out of a register into an adder in order to correct the bit which is then read out of a buffer. The output of the adder is read into a control signal reader which generates an output to a control unit indicative of the received control signal. In turn, the control unit generates an appropriate control signal or signals which effect the necessary correction of the error.

Another example of error correction in a digital transmission channel is shown by the patent to Merlow, U.S. Pat. No. 3,733,585, which effects alignment of the signal to be used to check the system. When a loss of alignment has occurred, the signal on the output lead is inhibited and replaced by a second output signal which is passed to a pattern acquisition control element. This in turn provides signals to the output terminal in order to delay the counting action of a clock counter. This delay caused by the clock counter causes a shifting of control pulses relative to the incoming digit stream. Once again, this system is directed toward a rechecking of data for errors which occur in the system and must be corrected prior to retransmission.

It is therefore an object of the present invention to provide an automatic alignment system in which the control voltage applied to one or more alignment points in an electronic circuit may be automatically adjusted on the basis of a performance indicator signal representing the performance quality of the circuit.

It is another object of the present invention to provide an automatic alignment system of the type described which avoids or otherwise overcomes the inherent deficiencies of known systems of this type and accomplishes this in a simple and economical manner.

SUMMARY OF THE INVENTION

The present invention relates to an automatic alignment system which consists of a control arrangement for automatically controlling the voltage applied to selected alignment points in a modem so as to optimize the operation thereof. This is accomplished by varying the control voltage of a particular alignment point and monitoring the effect thereof on the performance of the modem. Such adjustment of the control voltage for that alignment point is continued until optimum performance is obtained. This operation is performed in succession for all alignment points until full optimization of modem performance is achieved.

The automatic alignment system is microprocessor based and includes an interface circuit which responds to the microprocessor to output signals to the control points of the digital modem section of the data transmission system via a digital-to-analog converter to control the performance of the digital modem. The modem performance is monitored by the microprocessor and forms the indication on which modification of the input to the control point is based.

The control of the performance of the data transmission system is adjusted in such a manner as to minimize the readings from the performance indicator of the system. This adjustment for a minimum value rather than an absolute value means that neither the digital-to-analog converter nor the performance indicator readout need to be extremely accurate, but must be merely monotonic, which not only simplifies the system, but reduces the cost thereof. The automatic adjustment of the control points in the digital modem by the microprocessor allows the optimization of the data transmission system over a wide range of operating conditions.

The present invention provides for an alignment of the modem to optimize the performance of the system, which may have been changing as a function of atmospheric conditions, the seasons, the aging of components in the modem, or aging of components such as high powered amplifiers and the traveling wave tubes included therein, etc. Periodic alignment according to the present invention will provide an optimum performance for all of these link variations.

These and other objects, features and advantages of the present invention will become more apparent from the following detailed description involving an exemplary embodiment, which is illustrated in the accompanying drawings.

DETAILED DESCRIPTION

Figure 1:
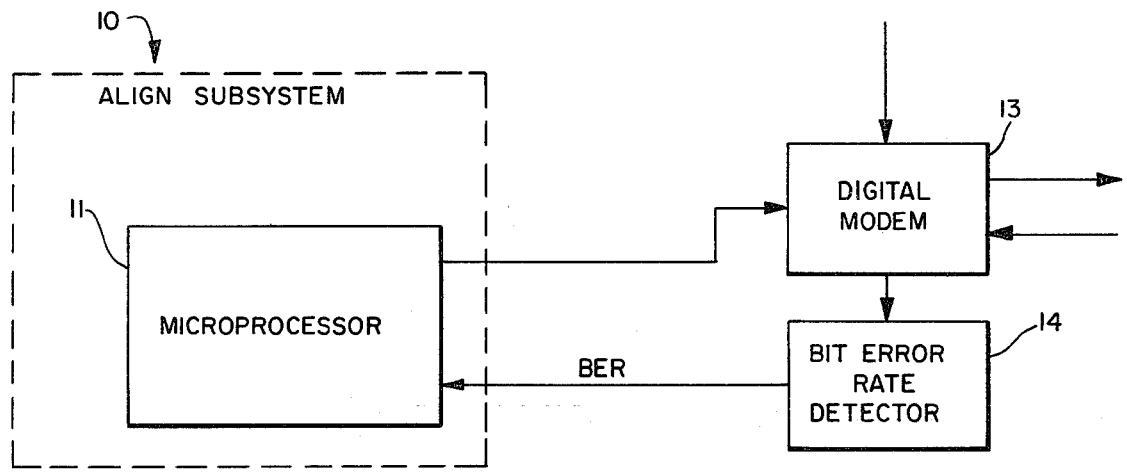
FIG. 1 is a block diagram of the basic auto alignment system of the present invention.

FIG. 1 is the basic block diagram of an automatic alignment system for use with a communication system. The align subsystem 10 includes a microprocessor 11, which processes data from a bit error detector 14, such as the aforementioned link performance indicator (LPI) disclosed in copending U.S. application Ser. No. 138,456, filed Apr. 8, 1980, to produce a bit error rate (BER) estimate. The microprocessor 11 adjusts the control voltage applied to the respective alignment points in the modem to minimize the reading from the detector 14.

One embodiment used with the present invention has a plurality of alignment points with the microprocessor 11 adjusting each alignment point in a predetermined order to minimize the LPI reading; however, as will be apparent from this description, the present invention is capable of automatic adjustment of one or any number of alignment points within an electronic system or component in the same manner described in connection with the exemplary embodiment. Since each alignment is based upon the selecting of a minimum value in the specific example described, neither the digital-to-analog converter 12, nor the bit error detector 14 need be extremely accurate, but merely monotonic.

Two alignment modes are provided in accordance with this invention, as will be discussed later in conjunction with the specifics of the operation of the system. A FAST mode is used for initial system installation and in the case of the installation of replacement units, and a TWEAK mode is used for adjustment due to changing RF path or aging characteristics. Each of these modes can be locally initiated by manual adjustment of the unit itself or remotely initiated.

Figure 2:
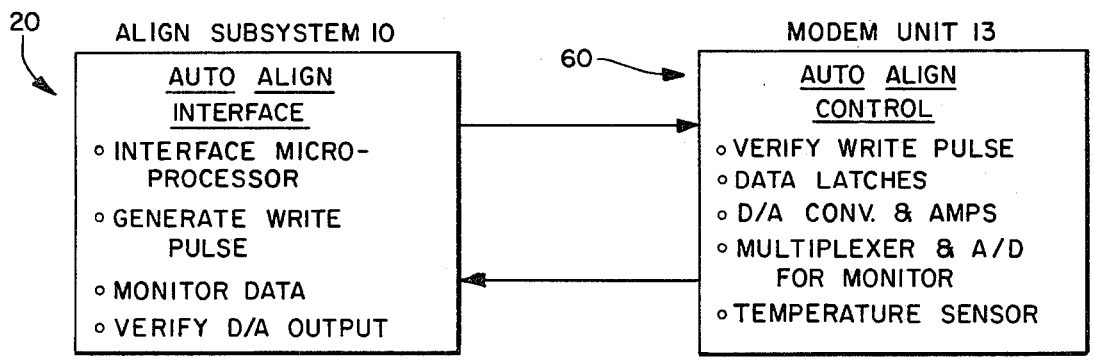
FIG. 2 is a diagram of the functional interrelationship of the microprocessor and control interface subsystem and the control section of the modem.

FIG. 2 shows a diagram of the functional interrelationship between the auto align interface 20 and the auto align control 60. The auto align interface 20 interfaces with the microprocessor 11 while generating a write pulse to control the digital input to the auto align control 60 in the modem 13. The microprocessor 11 also functions to monitor data coming in from the bit error detector 14 and to verify the output of the digital-to-analog converter in the modem 13. The auto align control 60 located in the modem 13 verifies that the digital-to-analog converter has been controlled in the desired manner and provides a multiplexer and an A/D converter for sending the control voltage to the interface 20. The auto align control 60 also contains a temperature sensor input to detect when changes in the temperature in the modem 13 indicate that the alignment of the modem should be checked to insure optimum modem performance.

Figure 3:
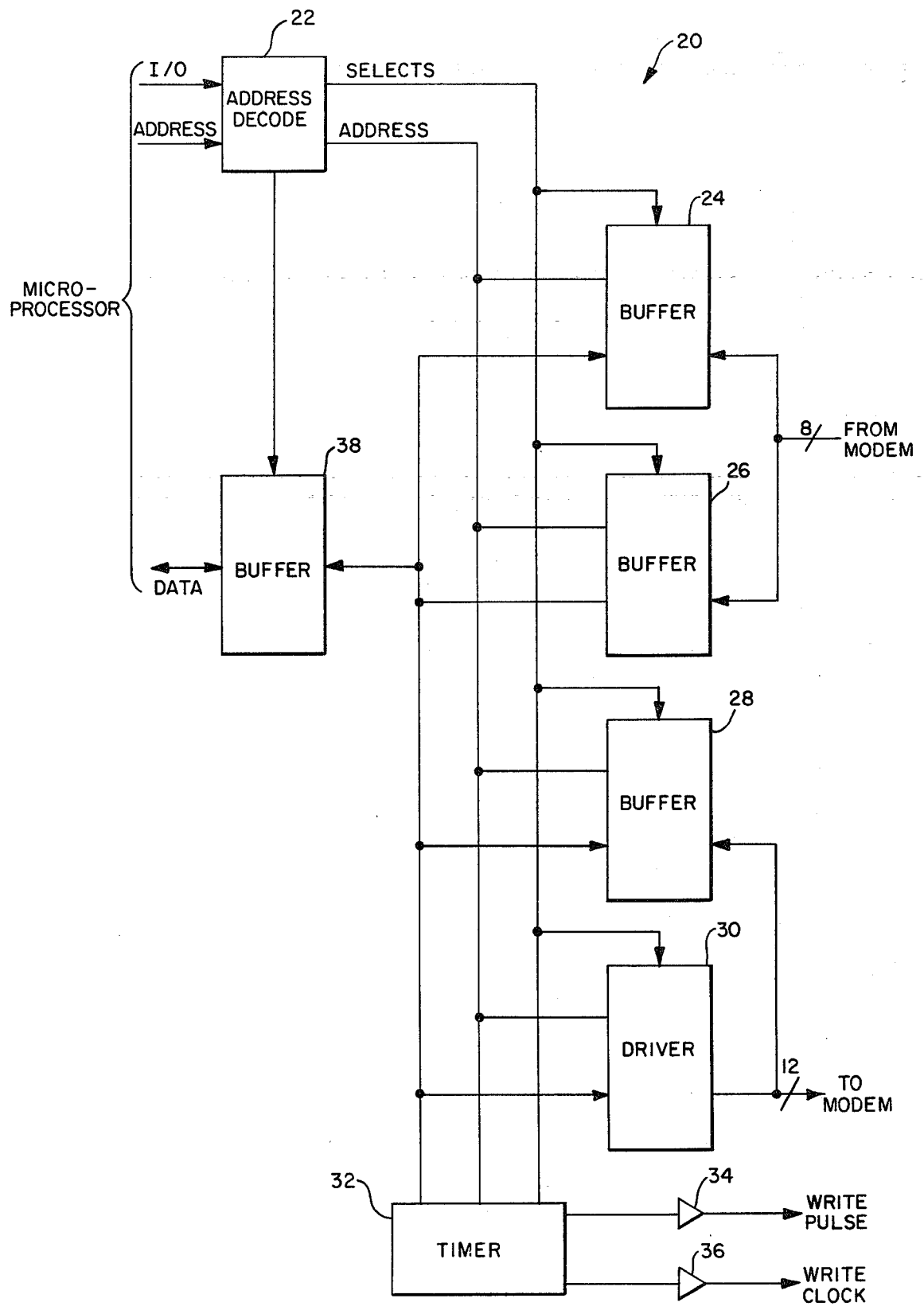
FIG. 3 is a detailed block diagram of the auto align interface.

FIG. 3 is a block diagram of the auto align interface 20 which includes an address decode unit 22 in communication with the microprocessor 11 and serves to select a pair of buffers 24 and 26 in order to receive information from the modem 13. The use of two buffers instead of one provides a read back redundancy in connection with the data received from the modem. The address decoder unit 22 also is capable of selecting buffer 28 and driver 30 in order to send alignment control data to the modem. The control of the sending and reception of the analog unit information is determined by the microprocessor 11, which controls the timer 32 to send out a write pulse to control the data reception and distribution at the modem. The write pulse and the write clock are outputted through the gates 34 and 36. A final buffer 38 controlled by the address decoder 22, provides the buffer for the data received from the analog unit which is to be fed to the microprocessor 11.

In operation, the "selects" output of the address decoder 22 serves to selectively enable the buffers 24–28 and the driver 30 for either the monitor portion of the operation, which involves the use of buffers 24 and 26, or the control portion of the operation wherein a DAC (digital/analog converter) signal is sent out through the driver 30 along with the address of the particular alignment point to be controlled. The buffer 28 acts to monitor the data which is being sent out to the modem through the driver 30. The information received from the modem and fed to buffers 24 and 26 consists of eight units of data information, while the signal output from the driver 30 to the modem consists of twelve units of information consisting of eight data units of information and four address units for a total of twelve.

Figure 4:
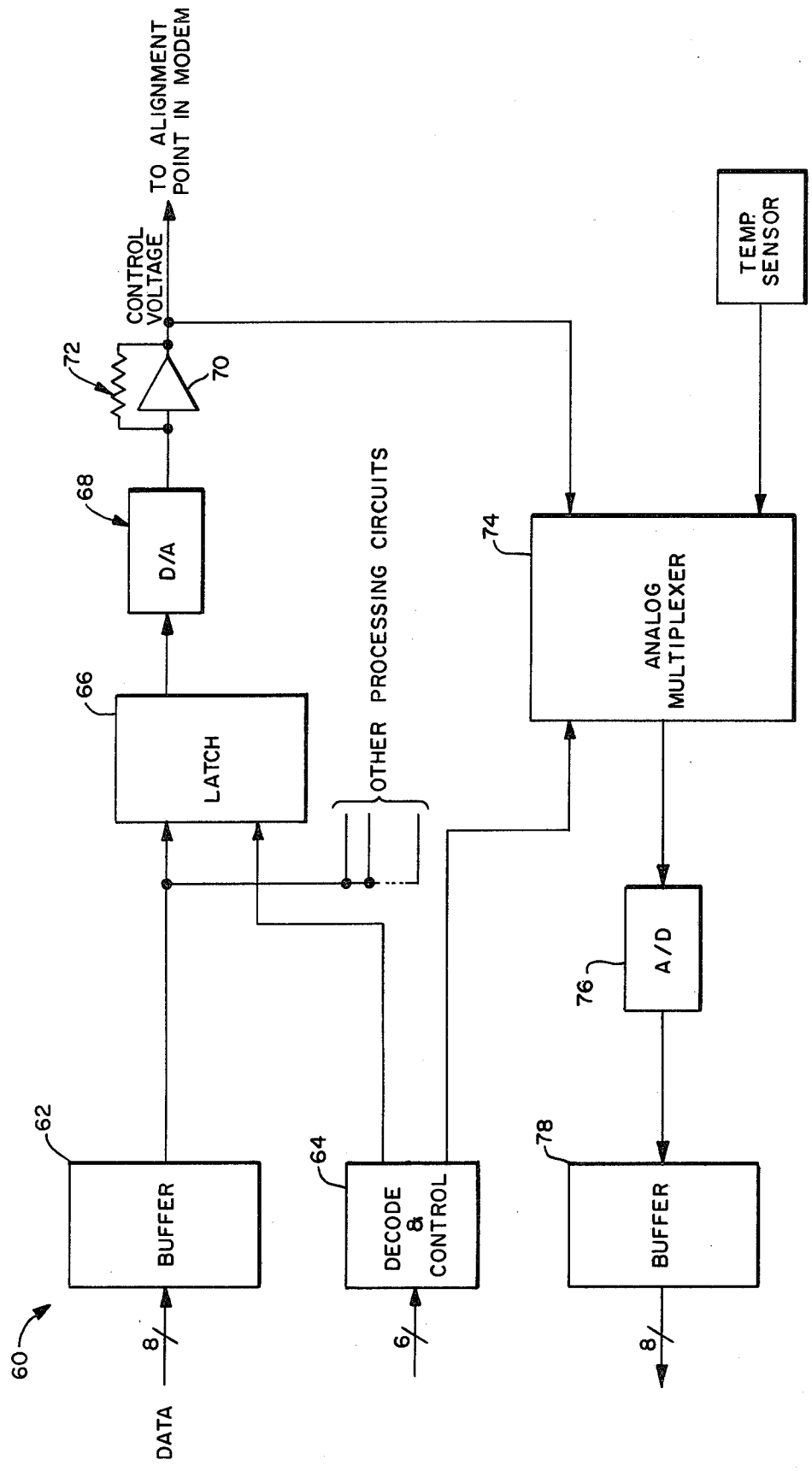
FIG. 4 is a detailed block diagram of the control section of the modem.

The auto align control section 60 of the modem, as shown in block diagram form in FIG. 4, consists of a buffer 62 which receives the eight units of data information from the driver 30 of the interface 20 and a decode and control section 64 which receives six units of information including the four address units outputted from the driver 30, as previously discussed. In addition, the section 64 receives the write pulse and the write clock outputted from the gates 34 and 36 connected to the programmable timer 32. The data in the buffer 62 is fed to a series of six identical control circuits (only one of which is shown) connected in parallel, each circuit consisting of a latch 66, a digital-to-analog converter 68 and an amplifier 70 having a feedback resistor 72 whose output represents the DAC voltage which is to be applied to a selected alignment point in the modem. The analog multiplexer 74 provides a feedback path for the DAC voltage derived from each of the six processing circuits and also provides a readout of the temperature sensor located in the modem. The output of the multiplexer 74 is converted in the analog-to-digital converter 76 to a digital readout to be fed through buffer 78 back to the interface 20 through the buffers 24 and 26, as previously discussed.

The analog multiplexer 74 is controlled by the decode and control unit 64 in a manner similar to the control of the latch 66 in each of the plurality of processing circuits. The output of the decode and control 64 selects one of the processing circuits, each of which contains a latch identical to latch 66, a digital-to-analog converter identical to converter 68 and an amplifier feedback resistor arrangement identical to components 70 and 72. Because there are a plurality of alignment points located on the modem in the exemplary embodiment described, the decode and control section 64 selects the particular processing circuit in response to the address received from the microprocessor 11 through the address and decode section 22 of the auto align interface 20.

At this point it should be noted that the readout of the bit error detector 14 is fed back to the microprocessor 11 so that the output LPI is monitored by the microprocessor 11 in order to detect the minimum values based upon changes in the DAC voltage as mandated by the changes to the alignment points.

Figure 5:
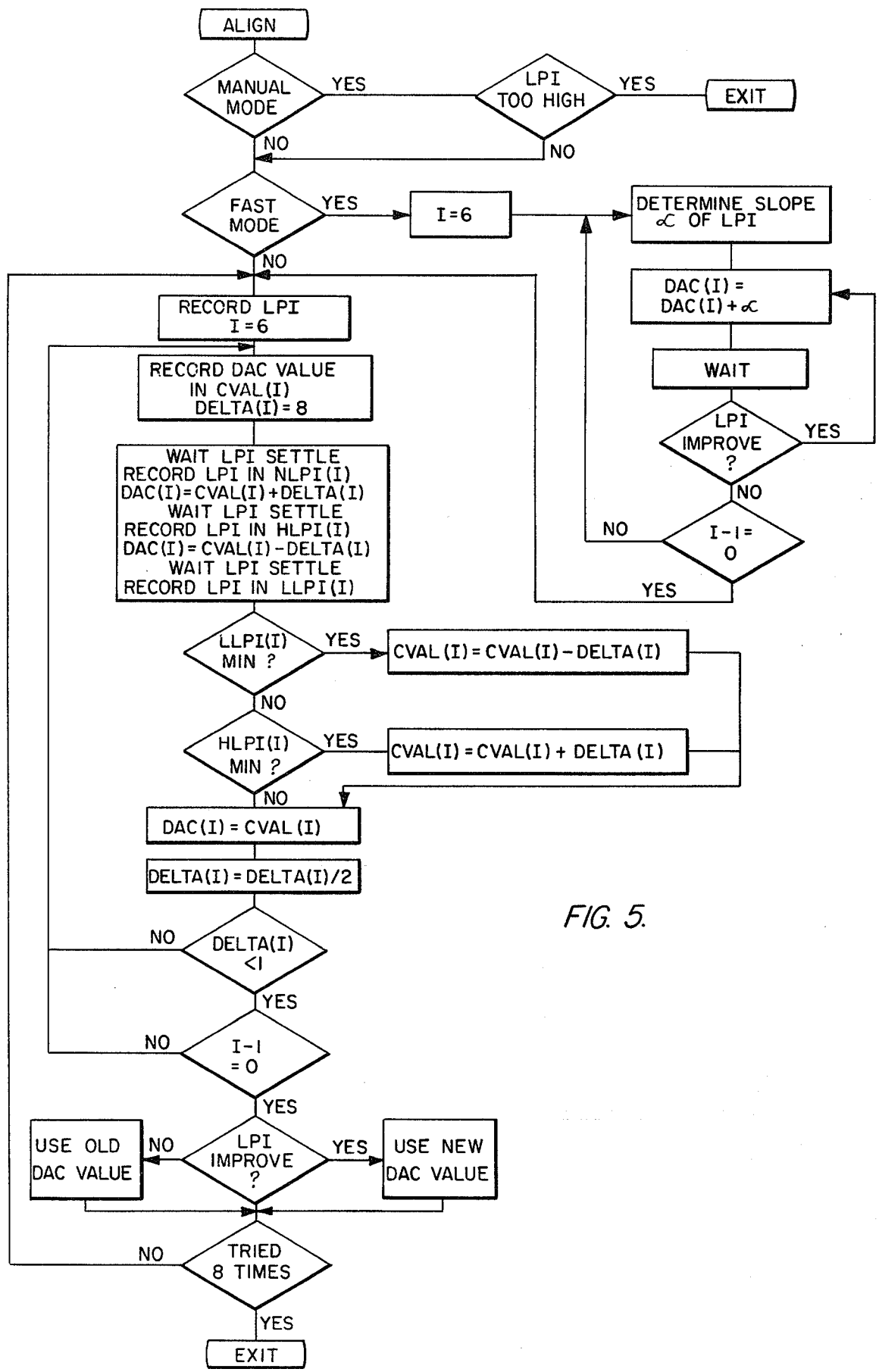
FIG. 5 is a flow chart of the production auto align process.

The alignment process using the interface between the microprocessor and the DAC voltages is carried out in a manner indicated by the flow chart of FIG. 5 with the assumption that six alignment points are to be controlled, for example. The system starts by entering the align mode, as indicated by the entry point at the top of FIG. 5. The first inquiry is whether the system is in the manual mode. If the answer is "yes", the bit error detector 14 is queried as to whether the LPI output therefrom is too high for the system to operate. If the LPI output exceeds a predetermined operational limit, the system quickly exits and the process is stopped. If the manual mode is not on, or if the LPI is not too high, the kind of mode which is to be implemented is queried at the block in the diagram labelled FAST MODE.

As previously stated, the FAST MODE is an initial alignment segment which is used when the system is installed or when an item has been replaced. If the system is in a FAST MODE, the term I (representing the number of processing circuits) is initialized to 6, and the slope $\alpha$ of the LPI signal is queried. That is, the slope of the LPI signal is determined in the microprocessor 11 and the next step sets a DAC (I) control voltage equal to DAC (I)+$\alpha$. The purpose of initializing the system to I=6 is to align the six separate points or to adjust their separate DAC voltages in a sequential manner.

The initial DAC values for each of the alignment points are stored in a non-volatile RAM (not shown) of the microprocessor 11 so that the alignment process can be effected after a power outage. Thus, the step DAC (I)=DAC (I)+$\alpha$ adds the value $\alpha$ to the value of the DAC voltage for alignment point No. 6 which is stored in the RAM of the microprocessor 11 in digital form. After this value has been changed by $\alpha$ and applied to the alignment point No. 6, the system waits for a settling time and then the LPI is inspected to determine whether it has been improved by this change in the DAC voltage. In this instance, the improvement of the LPI signal is with regard to its minimization. That is, if LPI has decreased in value, then the answer to the query obviously is yes, and the DAC voltage is further augmented by the value $\alpha$. This process continues until improvement in the LPI signal is no longer detected. As can be seen, the adjusting of the DAC voltage by an amount equal to the slope of LPI provides a course, but rapid adjustment of the alignment point. When this has occurred, the system addresses the next alignment point by decrementing I and considering the query I−1=0 to determine if all points have been addressed. If the answer is "no", then this next entry point again involves the determination of the slope $\alpha$ of the LPI signal with I equal to 5. The stored DAC value is added to the value $\alpha$ in the same manner as done for the previous alignment point in order to determine a new DAC value for I=5. This process continues until I−1=0 which will occur when each of the six alignment points has been minimized by the process of adding the slope $\alpha$ to the stored DAC value.

When I−1=0 and all alignment points have been adjusted for the FAST MODE operation, or when the FAST MODE operation is not in use as indicated by the "no" output of the FAST MODE block, an adjustment value of Delta=8 is initialized with I once again being set equal to 6. This phase of the operation is called a TWEAK mode and as previously stated is concerned with fine adjustments on the line which either supplement the FAST MODE operation or serve to compensate for changing system characteristics. The next step in the operation is a storing of the DAC values and a storing of the LPI signal value. These values will have been obtained from the initial operation, whether the FAST MODE was executed or whether the operation has proceeded straight from the manual mode to the TWEAK mode.

After the DAC values and the LPI values have been stored in the RAM, the LPI signal is allowed to settle and the recorded LPI is stored as NLPI (I). Then DAC (I) is set equal to CVAL (I)+Delta (I) and the new DAC signal is applied to the selected alignment point. Essentially, CVAL (I) is the current value of the DAC signal which is at that time stored in the RAM, and therefore, this step represents an incrementing of the stored DAC signal by Delta (I). After the new DAC value is applied to the alignment point, LPI is allowed to again settle and the current value of LPI is recorded in the RAM as a high range signal HLP(I). Then the DAC(I) value is set equal to the CVAL (I)−Delta (I), and this new control signal is applied to the selected alignment point. Once again LPI is allowed to settle and the LPI signal is stored in the RAM as a low-range signal LLPI (I). At this point, it will be recognized that there is now stored in the RAM (1) the value of LPI obtained in response to application of the current DAC value to the selected alignment point, (2) the LPI value HLPI(I) obtained in response to application of an incremented DAC value to the alignment point, and (3) the LLPI(I) value obtained in response to application of a decremented DAC value to the alignment point.

After these values have been stored, the low-range signal LLPI(I) is compared with the stored value of LPI, i.e., NLPI(I), and the high-range signal HLPI(I) to determine if it is the minimum of those three values. If it is the minimum, then this indicates that the decremented value of DAC has improved the LPI value, and so, CVAL (I) is set equal to CVAL−Delta (I) and DAC (I) is set equal to the new CVAL (I). If LLPI(I) is not smaller than HLPI(I) or NLPI(I), then the operation steps to the HLPI (I) minimum test which determines if the HLPI(I) value is less than LLPI(I) and NLPI(I) to determine if the incremented DAC value has resulted in improvement of LPI. If it has, then CVAL (I) is set equal to CVAL (I)+Delta (I). If neither LLPI(I) or HLPI(I) are of a lower value than NLPI(I), then the stored DAC(I) value is immediately set equal to the CVAL (I), and Delta (I) is set equal to Delta (I) divided by 2.

At this point, it is necessary to test whether Delta (I) is less than 1, and if it is not, the entire process beginning with the recording of the LPI in the RAM as NLPI(I) is repeated with the new value of Delta (I). This is a binary reduction which proceeds from Delta equals eight until Delta (I) is less than one. When Delta (I) is less than 1, the value of I is decreased by one and the entire process is repeated for the next alignment point. The operation continues until the I value equals zero. When the entire range of I values for the six alignment points have been completed, the next step which is performed is the LPI improvement test. If the LPI has been improved or further minimized, then the new DAC value is used and the last block queries whether this process has been tried eight times and if it has not, then the entire process is repeated from the entry point at which Delta is equal to 8 and I is set equal to 6. Once the process has been completed eight times, then the TWEAK alignment has been completed (in fact the total system alignment has been completed) and the program exits.

In operation, the addition of an automatic alignment interface 20 into the align subsystem 10, as well as the addition of an auto align control 60 into the modem 13, provides a means of automatically adjusting and controlling the voltages at the alignment points of the modem in order to minimize the reading output of the link performance indicator 14. When a new system is starting up or when a field replacable unit has just been installed, the FAST MODE, which is an initial alignment mode, provides for a rough adjustment of the control voltages in order to provide an operational system which can quickly minimize the "pseudo-error" readings of the output of the detector 14. Once this FAST MODE has been completed, the "fine tuning" is accomplished by the TWEAK mode which takes into account long term conditions affecting the system, such as the aging of the materials or the temperature effect on the operation. The interface 20, as shown at FIG. 3, in conjunction with the auto align control 60 of FIG. 4 provides the necessary data conversion and measurement as well as monitoring facilities to enable the microprocessor 11 to obtain the values necessary to determine the proper selection and amplitude of signals which are to be sent to the modem in order to effect control voltages which minimize the output of the detector 14.

Various changes or modifications may be made to the disclosed embodiments without departing from the spirit and the scope of the invention whch is embodied in the appended claims.

What is claimed is:

1. For use with a system for controllably operating upon a physical phenomenon wherein said physical phenomenon is subject to being controllably affected at a plurality of locations within said system, and from said system there is provided a measurement of the performance of said system, a method of optimizing said measured performance comprising, for respective ones of said locations, the steps of:

(a) adjusting the degree to which said physical phenomenon is controllably affected until, for such adjustment, there is no substantial improvement in said measured performance;

(b) establishing a prescribed range of controllably affecting said physical phenomenon about the degree of controllably affecting said phenomenon for which there was no substantial improvement in the measured performance in step (a);

(c) adjusting, over said range, the degree to which said physical phenomenon is controllably affected and measuring the performance of said system for each adjustment;

(d) comparing the optimum performance measured in step (c) with the optimum performance obtained in step (a); and (e) establishing the degree to which said physical phenomenon is affected in accordance with that degree which produced the optimum one of the measured performances compared in step (d).

2. A method according to claim 1, wherein step (a) comprises adjusting the degree to which said physical phenomenon is controllably affected in accordance with a prescribed characteristic of said performance measurement.

3. A method according to claim 1, further comprising, for said respective ones of said locations, the steps of (f) establishing said prescribed range of controllably affecting said physical phenomenon about the degree of controllably affecting said phenomenon established in step (e);

(g) adjusting, over the range established in step (f), the degree to which said physical phenomenon is controllably affected and measuring the performance of said system for each adjustment;

(h) comparing the optimum performance measured in step (g) with the measured performance obtained in response to affecting said physical phenomenon in accordance with the degree about which said range was established in step (f); and (i) establishing the degree to which said physical phenomenon is affected in accordance with that degree which produced the optimum one of the measured performance compared in step (h).

4. A method according to claim 3, further comprising, for said respective ones of said locations, the step of:

(j) repeating step (f), using the degree established in step (i), and steps (g)–(i) a prescribed number of times.

5. A method according to claim 1, wherein said system comprises a signal transmission system and said physical phenomenon corresponds to a signal coupled through said system.

6. A method according to claim 5, wherein said system comprises, at said respective locations, signal modifying elements for controllably modifying said signal.

7. A method according to claim 5, wherein said system comprises, at said respective locations, signal transmission control elements by which said system controllably affects said signal.

8. For use with a data communications device having a plurality of alignment points at each of which a respective control signal is applied for controlling the operation of said device, said device including means for providing a measurement of the performance thereof in response to the application of said respective control signals at said alignment points, a method of optimizing said measured performance comprising, for each of said alignment points, the steps of:

(a) adjusting said control signal until, for such adjustment, there is no substantial improvement in measured device performance;

(b) establishing a prescribed range of control signal adjustment about the value of said control signal for which there was no substantial improvement in the measured device performance in step (a);

(c) adjusting said control signal over said prescribed range and measuring the performance of said device for each value of said control signal;

(d) comparing the optimum device performance measured in step (c) with the optimum performance obtained in step (a); and (e) establishing the value of said control signal at that value which produced the optimum one of the measured device performances compared in step (d).

9. A method according to claim 8, wherein step (a) comprises adjusting said control signal in accordance with a prescribed characteristic of said device performance measurement.

10. A method according to claim 8, further comprising, for said locations, the steps of:

(f) establishing said prescribed range about the value of said control signal established in step (e);

(g) adjusting, over the range established in step (f), said control signal and measuring the performance of said device for each adjustment;

(h) comparing the optimum performance measured in step (g) with the measured performance obtained in response to establishing said control signal at the value established in step (e); and (i) establishing said control signal at the value which produces the optimum one of the measured performances compared in step (h).

11. A method according to claim 10, further comprising, for said respective locations, the steps of (j) repeating step (f), using the control signal value established in step (i) and steps (g)–(i) a prescribed number of times.

12. For use with a system for controllably operating on a physical phenomenon wherein said physical phenomenon is subject to being controllably affected at a plurality of locations within said system, a method of establishing the degree to which said physical phenomenon is controllably affected comprising the steps of:

(a) measuring the performance of said system irrespective of prior knowledge of any prescribed characteristic in accordance with which said physical phenomenon is controlled; and (b) adjusting, at respective ones of said plurality of locations within said system, the degree to which said physical phenomenon is controllably affected on the basis of the performance measured in step (a).

13. A method according to claim 12, wherein step (b) comprises adjusting the degree to which said physical phenomenon is controllably affected so as to optimize the performance of said system measured in step (a).

14. A method according to claim 13, wherein step (b) comprises the steps of:

(b1) carrying out a coarse adjustment of the degree to which said physical phenomenon is controllably affected so as to improve measured system performance; and (b2) carrying out a fine adjustment of the degree to which said physical phenomenon is controllably affected, relative to a prescribed degree providing improved measured system performance in step (b1), until the performance of said system is optimized.

15. A method according to claim 14, wherein step (b1) comprises:

adjusting the degree to which said physical phenomenon is controllably affected until, for such adjustment, there is no substantial improvement in the performance measured in step (a).

16. A method according to claim 14, wherein step (b2) comprises:

(b2-1) establishing a prescribed range of controllably affecting said physical phenomenon about the degree of controllably affecting said phenomenon for which there was no substantial improvement in the performance measured in step (a);

(b2-2) adjusting, over said range, the degree to which said physical phenomenon is controllably affected and measuring the performance of said system for each adjustment;

(b2-3) comparing the optimum performance measured in step (b2-2) with the optimum performance obtained in step (a); and (b2-4) establishing the degree to which said physical phenomenon is affected in accordance with that degree which produced the optimum one of the measured performances in step (b2-3).

17. A method according to claim 16, wherein step (a) comprises adjusting the degree to which said physical phenomenon is controllably affected in accordance with a prescribed characteristic of said performance measurement.

18. A method according to claim 12, wherein said system comprises a signal transmission system and said physical phenomenon corresponds to a signal coupled through said system.

19. A method according to claim 18, wherein said system comprises, at said respective locations, signal modifying elements for controllably modifying said signal.

20. A method according to claim 18, wherein said system comprises, at said respective locations, signal transmission control elements by which said system controllably affects said signal.

* * * * *